(12) United States Patent
Li et al.

(10) Patent No.: US 11,843,368 B2
(45) Date of Patent: Dec. 12, 2023

(54) METHOD FOR REDUCING OSCILLATION DURING TURN ON OF A POWER TRANSISTOR BY REGULATING THE GATE SWITCHING SPEED CONTROL OF ITS COMPLEMENTARY POWER TRANSISTOR

(71) Applicant: Infineon Technologies AG, Neubiberg (DE)

(72) Inventors: Zheming Li, Bayreuth (DE); Mark-Matthias Bakran, Erlangen (DE); Daniel Domes, Ruethen (DE); Robert Maier, Bayreuth (DE); Franz-Josef Niedernostheide, Hagen Am Teutoburger Wald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/060,639

(22) Filed: Dec. 1, 2022

(65) Prior Publication Data

US 2023/0088339 A1 Mar. 23, 2023

Related U.S. Application Data

(62) Division of application No. 17/458,942, filed on Aug. 27, 2021, now Pat. No. 11,595,035.

(51) Int. Cl.
*H03K 17/04* (2006.01)
*H03K 17/042* (2006.01)
*H03K 5/24* (2006.01)

(52) U.S. Cl.
CPC ......... *H03K 17/04206* (2013.01); *H03K 5/24* (2013.01); *H03K 17/042* (2013.01); *H03K 17/0406* (2013.01)

(58) Field of Classification Search
CPC ......... H03K 17/0406; H03K 17/04206; H03K 2217/0027; H03K 17/042; H03K 17/06;
(Continued)

(56) References Cited

U.S. PATENT DOCUMENTS 10,461,730 B1 * 10/2019 Mariconti ............ H03K 17/168
10,819,237 B1   10/2020 Petrina et al.

OTHER PUBLICATIONS

Co-pending U.S. Appl. No. 17/458,942, inventors Zheming; Li et al., filed Aug. 27, 2021.

(Continued)

*Primary Examiner* — Jung Kim
(74) *Attorney, Agent, or Firm* — Harrity & Harrity, LLP

(57) ABSTRACT

A method is provided for driving a half bridge circuit that includes a first transistor and a second transistor. The method includes generating an off-current during a plurality of turn-off switching events to control a gate voltage of the second transistor; measuring a transistor parameter of the second transistor during a first turn-off switching event during which the second transistor is transitioned to an off state, wherein the transistor parameter is indicative of an oscillation at the first transistor during a corresponding turn-on switching event during which the first transistor is transitioned to an on state; and activating a portion of the off-current for the second turn-off switching event, including regulating an interval length of the second portion for the second turn-off switching event based on the measured transistor parameter measured during the first turn-off switching event.

14 Claims, 11 Drawing Sheets

(58) Field of Classification Search
CPC .. H03K 17/08; H03K 17/082; H03K 17/0822; H03K 17/12; H03K 17/122; H03K 5/24; H03K 17/165; H03K 17/284
See application file for complete search history.

(56) References Cited

OTHER PUBLICATIONS

Frank., "Simple Slew-Rate Control Technique Cuts Switching Losses," PCIM Europe 2019. International Exhibition and Conference for Power Electronics, 2019, pp. 1-5.
Handt et al., "Fully Digitised, Quasi-Continuous Working Gate-Drive Unit for 1200V-IGBT," Doi:0.11 09/ EPE.2013.6634605, 2021, pp. 1-10.
Li et al., "Mitigating Drain Source Voltage Oscillation with Low Switching Losses for SiC Power MOSFETs Using FPGA-Controlled Active Gate Driver," 2020 22nd European Conference on Power Electronics and Applications (EPE'20ECCEEurope), doi:10.23919/EPE20ECCEEurope43536.2020.9215813 2020, pp. 1-10.
Luedecke et al., "Optimized IGBT Turn-On Switching Performance Using the Full Device Safe Operating Area," PCIM Europe 2019. International Exhibition and Conference for Power Electronics, 2019, pp. 1-8.
Rogers et al., "Digital Active Gate Drives using sequential optimization." Department of Engineering Science, doi:10.1109/APEC. 2016.7468088, 2016, pp. 1650-1656.

\* cited by examiner

METHOD FOR REDUCING OSCILLATION DURING TURN ON OF A POWER TRANSISTOR BY REGULATING THE GATE SWITCHING SPEED CONTROL OF ITS COMPLEMENTARY POWER TRANSISTOR

RELATED APPLICATION

This application is a divisional of U.S. patent application Ser. No. 17/458,942, filed Aug. 27, 2021 and issued as U.S. Pat. No. 11,595,035 on Feb. 28, 2023, which is incorporated herein by reference in its entirety.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device (e.g., a power transistor) usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state. Accordingly, the power semiconductor device behaves like a switch with on and off states (i.e., conducting and blocking states, respectively).

A power transistor is a power semiconductor device that may be used to drive a load current. There is a turn-on process and a turn-off process for switching the power transistor on and off. During the turn-on process, a gate driver integrated circuit (IC) is used to provide (source) a gate current to the gate of the power transistor in order to charge the gate. In contrast, during the turn-off process, the gate driver IC is used to draw (sink) a gate current from the gate of the power transistor in order to discharge the gate and thus lower the gate voltage.

A large number of such circuits work with so-called hard switching. During the transition from blocking to conducting operation of the power transistor, i.e., the so-called switch-on process, both blocking voltage and current flow through the power transistor exist simultaneously for a short time. This inevitably leads to switching losses. With the goal of highly efficient circuits and ever higher switching frequencies, it is necessary to reduce the switching losses of the component.

For driving a load in this manner, two power transistors are typically arranged in a half-bridge configuration. A first power transistor, when on, is responsible for conducing load current in order to source the load current to the load while its complementary power transistor is turned off (i.e., the second power transistor is in blocking mode). In order to sink load current from the load, the roles of the two transistors are reversed. Here, the second power transistor, when on, is responsible for conducing load current in order to sink the load current from the load while its complementary power transistor is turned off (i.e., the first power transistor is in blocking mode). The power transistor that is switched on for either sourcing or sinking load current is referred to as the active power transistor, whereas the power transistor that is switched off while the other is switched on is referred to as the complementary power transistor or passive power transistor. The roles between the two half-bridge power transistors change in a complementary manner, where one power transistor is the active power transistor and the other power transistor is the passive power transistor depending on whether load current is being sourced to or sinked from the load. Thus, both power transistors operate as the active power transistor and as the passive power transistor, with the first power transistor being the active power transistor and the second power transistor being the passive power transistor while load current is provided to the load and with the first power transistor being the passive power transistor and the second power transistor being the active power transistor while load current is drawn from the load.

The switching behavior of the power switch is set by the control at the control terminal of the power transistor. Simple control systems work with two voltage levels and a series resistor for voltage-controlled components. The smaller the series resistor, the faster the switching speed and the lower the switching loss. However, the switching performance of the simple control system is mostly insufficient. On the one hand, the series resistor cannot be selected arbitrarily small, since a voltage oscillation tendency exists at the passive power transistor when the active switch is switched on quickly. In addition to the voltage oscillation tendency, there is also the risk of an electrical overload of the passive power transistor due to switching too fast.

On the other hand, the simple control results in a uniform control behavior, which is constant across all operating points of the active power transistor. These operating points depend on the following parameters: VDC, drain current ID, the junction temperature of the power transistor, and the gate driver voltage applied to the gate. However, due to the large operating range in which the power transistor is operated, especially for silicon carbide (SiC) transistors, this results in a control which does not behave optimally for a wide operating range (i.e., for a wide range of operating points).

Oscillation is considered undesirable in terms of electromagnetic compatibility or electromagnetic interference emission. However, it is not easy to set a clear switching speed limit because the behavior of the overall system, including the switching speed limit itself, always depends on the circuit environment. Also, with regard to the voltage oscillation tendency of the passive power transistor, the "simple control" cannot be used to set the switch-on process of the active power transistor optimally for each operating point.

The oscillation is considered undesirable in terms of electromagnetic compatibility or electromagnetic interference. However, it is not easy to set a clear switching speed limit. This switching speed limit value always depends on the soldering environment. Also, with regard to the tendency to oscillate, "simple control" means that the switching process cannot be optimally set for each operation point vector.

To achieve fast turn-on of the active power transistor and small voltage oscillations of the passive switch for the whole operating range, an improved control is necessary.

In order to optimize the switching process of modern power electronic switches, including SiC transistors, control devices with two-stage or multi-stage switching speeds are often used. This more complex control can improve the conflict of objectives mentioned above.

The necessary setting of a time duration or a temporal portion of the respective switching speed is strongly dependent on the operation point vector. As a result of this dependency, a control or regulation should be used that sets the corresponding time duration or temporal portion of a switching stage implemented by the control device for a respective operation point vector of the power transistor. Therefore, an improved device that enables regulation of a time duration or a temporal portion of a switching stage for each operation point of the power transistor may be desirable. Namely, to achieve fast turn-on of the active power transistor and small voltage oscillations of the passive switch for the whole operating range, an improved control is desired.

SUMMARY

One or more embodiments provide a gate driver system configured to drive a load, the gate driver system configured to drive a half bridge circuit including a first transistor and a second transistor that are switched in a complementary manner, the gate driver system including: a gate driver circuit coupled to a gate terminal of the second transistor and configured to control a gate voltage at the gate terminal in order to drive the second transistor between switching states, the gate driver circuit configured to generate an off-current during a plurality of turn-off switching events to turn off the second transistor, wherein the gate driver circuit includes a first driver configured to sink a first portion of the off-current from the gate terminal to discharge a first portion of the gate voltage, wherein the gate driver circuit includes a second driver configured to, during a boost interval, sink a second portion of the off-current from the gate terminal to discharge a second portion of the gate voltage; and a control circuit configured to measure a transistor parameter of the second transistor during a first turn-off switching event during which the second transistor is transitioned to an off state, wherein the transistor parameter is indicative of an oscillation at the second transistor during a corresponding turn-on switching event during which the first transistor is transitioned to an on state, wherein the control circuit is further configured to control the first driver to sink the first portion of the off-current and to control the second driver to sink the second portion of the off-current, and wherein the control circuit is further configured to regulate a length of the boost interval based on the measured transistor parameter.

One or more embodiments provide a method of driving a half bridge circuit including a first transistor and a second transistor that are switched in a complementary manner, the method including: generating an off-current during a plurality of turn-off switching events to control a gate voltage at a gate terminal of the second transistor, wherein generating the off-current includes sinking a first portion of the off-current from the gate terminal to discharge a first portion of the gate voltage, and sinking, during a boost interval, a second portion of the off-current from the gate terminal to discharge a second portion of the gate voltage; measuring a transistor parameter of the second transistor during a first turn-off switching event during which the second transistor is transitioned to an off state, wherein the transistor parameter is indicative of an oscillation at the second transistor during a corresponding turn-on switching event during which the first transistor is transitioned to an on state; activating the first portion of the off-current for a second turn-off switching event during which the second transistor is transitioned to the off state; and activating the second portion of the off-current for the second turn-off switching event, including regulating a length of the boost interval for the second turn-off switching event based on the measured transistor parameter measured during the first turn-off switching event.

BRIEF DESCRIPTION OF THE DRAWINGS

Embodiments are described herein making reference to the appended drawings.

DETAILED DESCRIPTION

Figure 1:
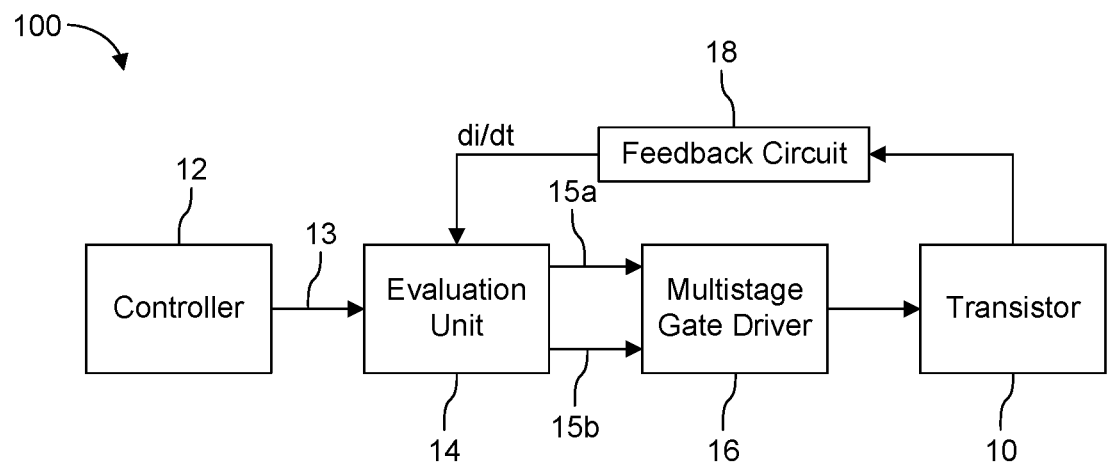
FIG. 1 is a schematic block diagram of a gate driver system with slew-rate control (SRC) according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate voltage sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches approximately 0V or a negative driving value. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges comprising a first power transistor and a second, complementary power transistor, may be used for driving electric motors or switched mode power supplies. The first power transistor may be referred to as a high-side transistor and the second power transistor may be referred to as a low-side transistor.

The first power transistor, when ON, is responsible for conducting load current in order to source the load current to the load while its complementary power transistor is turned off (i.e., the second power transistor is in blocking mode). In order to sink load current from the load, the roles of the two transistors are reversed. Here, the second power transistor, when ON, is responsible for conducing load current in order to sink the load current from the load while its complementary power transistor is turned off (i.e., the first power transistor is in blocking mode). The power transistor that is switched on for either sourcing or sinking load current is referred to as the active power transistor, whereas the power transistor that is switched off while the other is switched on is referred to as the complementary power transistor or passive power transistor.

The roles between the two half-bridge power transistors change in a complementary manner, where one power transistor is the active power transistor and the other power transistor is the passive power transistor depending on whether load current is being sourced to or sinked from the load. Thus, both power transistors operate as the active power transistor and as the passive power transistor, with the first power transistor being the active power transistor and the second power transistor being the passive power transistor while load current is provided to the load and with the first power transistor being the passive power transistor and the second power transistor being the active power transistor while load current is drawn from the load.

As an example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to each other for driving a phase load.

FIG. 1 is a schematic block diagram of a gate driver system 100 with slew-rate control (SRC) according to one or more embodiments. The gate driver system 100 includes a power transistor 10, control circuitry, and gate driver circuitry that implements a scheme for SRC of the power transistor 10 during turn-off. In particular, different switching speeds, and thus different slew-rates, can be implemented for turn-off of the power transistor 10 (i.e., during a switching transition). The power transistor may be implemented as either a low-side transistor or a high-side transistor in a half-bridge circuit. Moreover, for a half-bridge circuit, the gate driver system 100 can be provided in duplicate, where the gate driver system 100 is provided for both high-side and low-side transistors The gate driver system 100 includes a controller 12, an evaluation unit 14, a multistage gate driver 16, the transistor 10, and a feedback circuit 18. The controller 12 may be a microcontroller that generates a control signal 13 for controlling a switching state of the transistor 10. For example, the control signal 13 may be a pulse-width modulation (PWM) control signal that provides switch-on and switch-off commands to the evaluation unit 14. Alternatively, the control signal 13 may represent one of two separate control signals, including one switch-on control signal and one switch-off control signal. As used herein, the term "switch-on" may be used interchangeably with the term "turn-on" when referring to switching on a transistor. Similarly, as used herein, the term "switch-off" may be used interchangeably with the term "turn-off" when referring to switching off a transistor.

A multilevel control signal of three or more levels may allow for different levels (e.g., speed stages or speed levels) of switch-off to be implemented. For example, a multilevel control signal with three possible levels (e.g., voltage levels) may be able to indicate two different turn-off switching speed stages and a single turn-on switching speed stage. Similarly, if two separate control signals are used for turn-on and turn-off control, the turn-off control signal may be implemented as a multilevel control signal where each level corresponds to a different switching speed stage. For example, a multilevel switch-off command having two possible levels may be used to indicate two different turn-off switching speed stages. Thus, one of two different turn-off switching speed stages may be activated according to the control signal 13. It will also be appreciated that three or more speed stages may be used for turn-off.

The evaluation unit 14 is configured to receive the control signal 13 and control the multistage gate diver 16 based thereon. In one example, the evaluation unit 14 may be an FPGA or other signal processing circuit. In particular, the evaluation unit 14 may activate or deactivate one or more switching speed stages for turn-on and/or turn-off based on the control signal 13. In addition, the evaluation unit 14 further receives feedback information (i.e., di/dt) and further controls a duration or temporal portion of one or more of the turn-off switching speed stages. Thus, the evaluation unit 14 controls a timing or one or more turn-off switching speed stages based on the control signal 13.

A primary driver is configured to control a turn-on and turn-off of the power transistor 10. During a turn-on switching stage, the primary driver provides an ON current (i.e., current Io+) to the control terminal (i.e., the gate terminal) of the power transistor 10. For a multi-stage driver that does not have an independent turn-on boost stage, the turn-on switching speed and slew rate of the power transistor 10 is defined by the size of the resistors coupled between the primary driver and the control terminal. Here, the slew rate is may refer to the slope of the drain-source voltage VDS of the power transistor. or to the slope of the drain current iD. The slew rates of both VDS and iD are regulated. The drain current may be referred to as a load current and the drain-source voltage VDS may be referred to as a voltage across the load terminals of a transistor. For an IGBT, the voltage across the load terminals is the collector-emitter voltage VCE.

A constant ON current (i.e., current Io+) is maintained for a turn-on interval during which the transistor 10 transitions from the OFF state to the ON state and is maintained in the ON state. The ON current loads the gate terminal of a power transistor so that the gate voltage is sufficient to turn on the transistor 10. In addition, a slew rate control technique uses a boost-off interval and a turn-off interval. The boost-off interval may generally be referred to as a boost interval, whereas the turn-on interval and the turn-off interval may generally be referred to as switching state intervals.

In contrast, a turn-off switching stage sinks an off current (i.e., current Io−) from the control terminal (i.e., the gate terminal) of the power transistor 10. One or more turn-off switching speed stages may be activated to regulate the off current and the gate voltage, and thus, regulate the turn-off switching speed and slew rate of the power transistor.

In particular, a boost-off current may discharge the gate terminal so that the gate voltage is sufficient to turn off the transistor 10. Alternatively, the boost-off current may be a preboost-off current that discharges the gate terminal of a power transistor so that the gate voltage is close, but still above the pinch-off voltage so that the transistor is still on. Subsequently, the turn-off current level is applied during the turn-off interval in order to turn off the transistor. The amplitude of the turn-off current is often lower than the boost-off current amplitude but is sufficient to turn off the transistor and/or keep the transistor turned off. Whether or not a boost-off current for accelerated turn-off switching is used may be indicated by the control signal 13.

The turn-off process of power transistors is often dominated by a longer turn-off propagation delay time. The propagation delay is dominating the dimensioning of the dead time in half-bridge configurations. Since no energy is transferred to the load of power electronic converters, it is a target to reduce the dead time as much as possible. An individual and automated adjustment of the turn-off process, and particularly the boost-off duration TB or a temporal component thereof, according to the operation point vector of the power transistor 10 is desired in order to achieve the optimal performance of the power transistor and its complementary power transistor (i.e., the active power transistor). The boost-off duration TB may be referred to as an acceleration duration, a boost duration, a boost time, or a boost interval.

The evaluation unit 14 is configured to determine whether a boost-off current is used and which turn-off switching stage is to be activated for the boost stage based on the control signal 13. In addition, the feedback information (i.e., di/dt) is representative of the real-time operation point vector of the transistor 10. The evaluation unit 14 uses the feedback information (i.e., di/dt or ΔV) to determine a time duration or temporal portion for a boost stage (TB), and thus, for the activated turn-off switching stage. In addition, it is possible that two or more turn-off switching stages may be used. The two or more turn-off stages may be activated and deactivated synchronously, activated synchronously and deactivated asynchronously, or activated and deactivated asynchronously. For example, two turn-off stages may be activated at the same time and deactivated sequentially based on different deactivation times. Furthermore, each turn-off stage may be activated for a same duration or for different durations.

The multistage gate driver 16 includes one control stage for turn-on and one or more control stages for turn-off of the transistor 10. As explained above, different turn-off switching stages may be used to control how quickly the transistor 10 turns off. Thus, each switching stage corresponds to a different switching speed that regulates the slew rate of the transistor 10 during a turn-off switching event (i.e., during a turn-off transient).

The feedback circuit 18 as part of a control circuit is configured to measure a characteristic of the power transistor 10 in order to derive the time derivative of the switching current (i.e., load current) of the transistor 10 or to derive a parameter directly proportional to the time derivative (e.g., ΔV). Thus, the feedback circuit 18 measures the feedback information (i.e., di/dt or ΔV). Thus, the time derivative of the switching current di/dt is actually the time derivative of the load current diD/dt. As will be described below, the time derivative of the switching current may be derived from measuring a voltage across a stray inductance included in the load path and coupled in series to the power transistor 10. According to Ohm's Law (diD/dt=ΔV/L), the voltage difference ΔV across the stray inductance is proportional to diD/dt and this voltage difference ΔV can be compared to one or more thresholds for regulating the first and second boost phases. In other words, ΔV can be used as a representation of diD/dt.

Figure 2A:
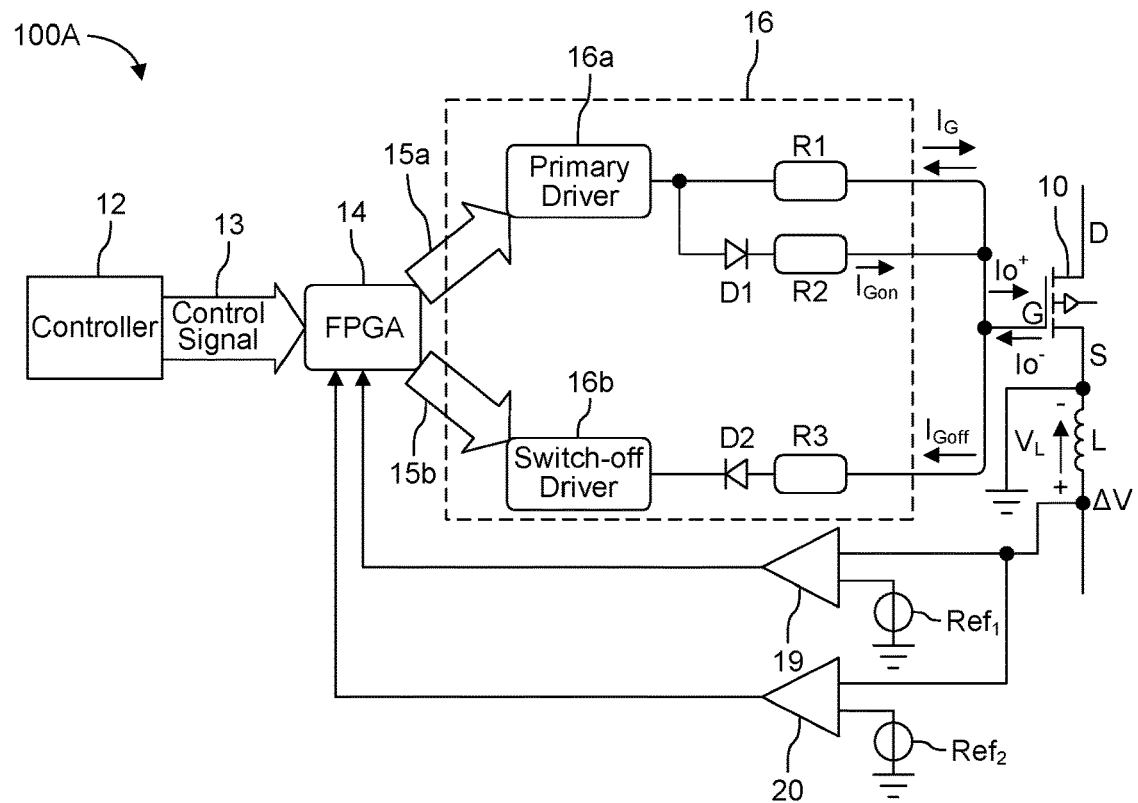
FIG. 2A is a schematic diagram of the gate driver system with a measurement circuit according to one or more embodiments.
Figure 2B:
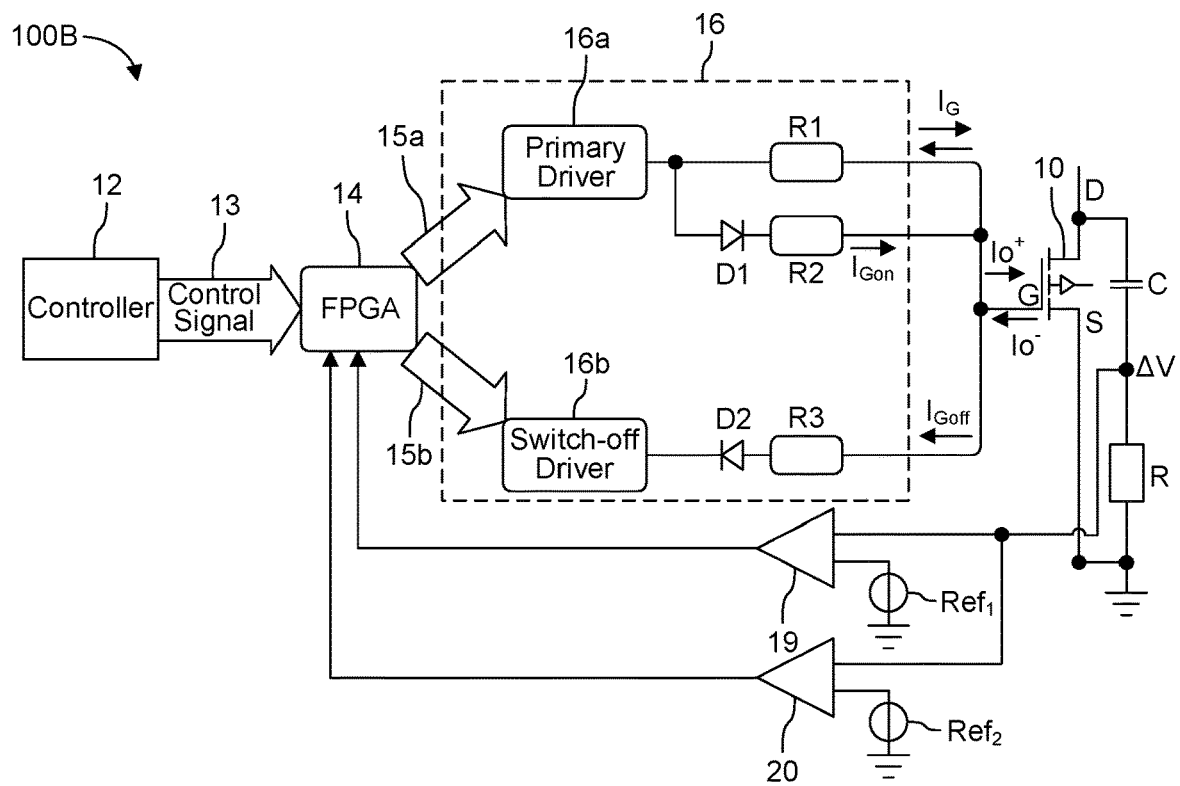
FIG. 2B is a schematic diagram of the gate driver system with another measurement circuit according to one or more embodiments.
Figure 2C:
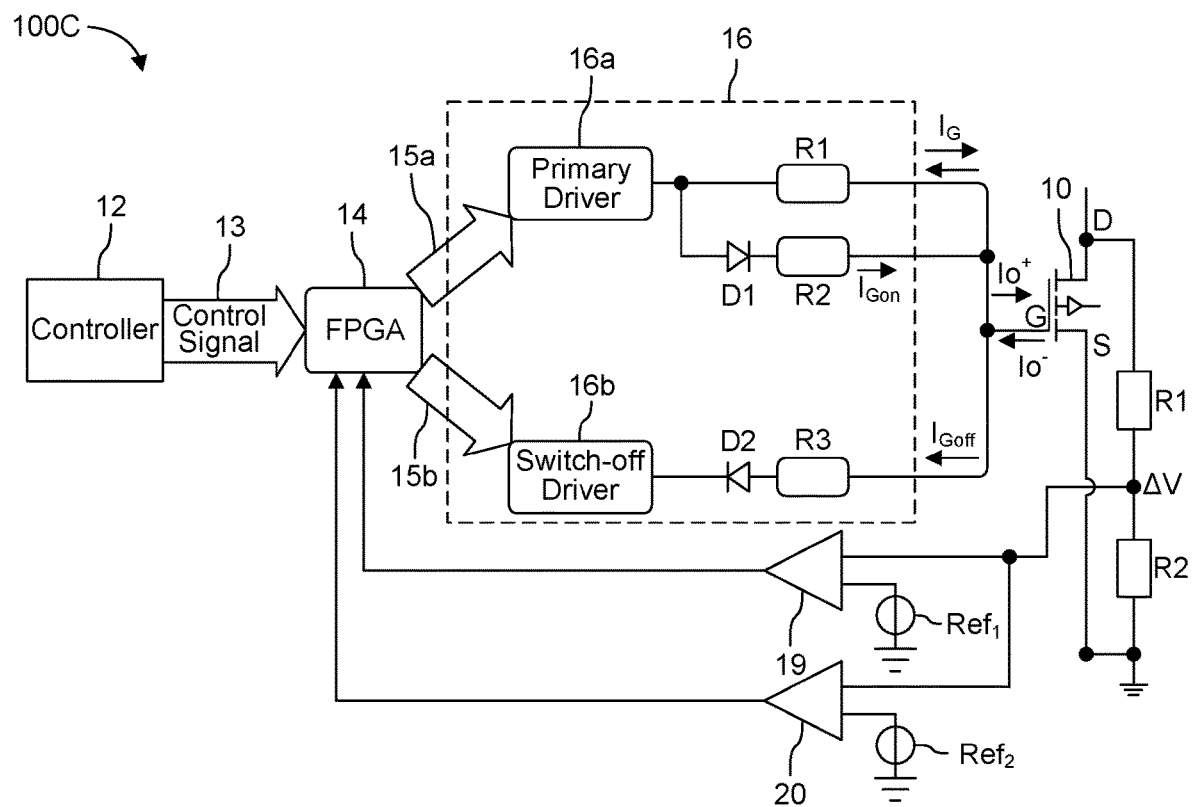
FIG. 2C is a schematic diagram of the gate driver system with another measurement circuit according to one or more embodiments.
Figure 2D:
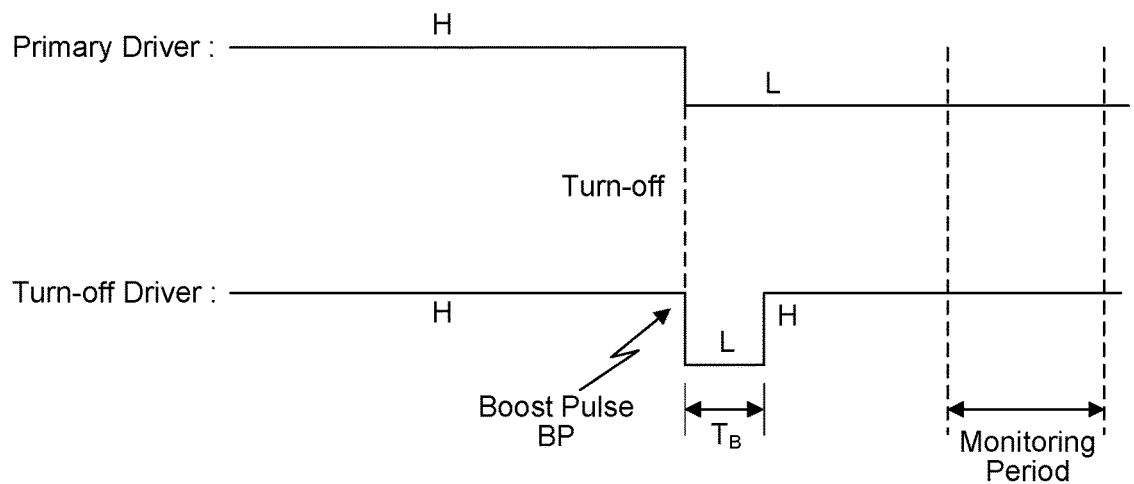
FIG. 2D is a waveform diagram of a control voltages generated by the drivers of the multistage gate driver during turn-off of a power transistor according to one or more embodiments.

FIG. 2A is a schematic diagram of the gate driver system 100A including a measurement circuit according to one or more embodiments. FIG. 2B is a schematic diagram of the gate driver system 100B including another type of measurement circuit according to one or more embodiments. FIG. 2C is a schematic diagram of the gate driver system 100C including another type of measurement circuit according to one or more embodiments. FIG. 2D is a waveform diagram of a control voltages generated by the drivers of the multistage gate driver 16 during turn-off of the power transistor 10 according to one or more embodiments. It will be appreciated that while the power transistor 10 is depicted as a low-side transistor, a similar gate driver system is also provided for the high-side transistor of the complementary transistor pair. Thus, the gate driver system is duplicated for each power transistor.

The multistage gate driver 16 of the present example is illustrated using the example of a two-stage control for turn-off. The two turn-off stages are implemented by two separately controllable series resistors R1 and R3. In addition, a single turn-on stage is implemented by two separately controllable series resistors R1 and R2.

In general, the gate driver system 100 measures a time derivative of the switching current diD/dt or ΔV during turn-off of transistor 10 and compares the time derivative of switching current diD/dt or ΔV with a trigger threshold (e.g., an overshoot threshold) to determine a comparison result. Based on the comparison result, the gate driver system 100 adapts a duration TB or a temporal portion of an accelerated turn-off stage during which the accelerated turn-off stage is activated, thereby adapting its respective switching speed.

The multistage gate driver 16 includes a primary driver 16a configured to control turn-on and turn-off of the power transistor 10. The multistage gate driver 16 further includes a switch-off driver 16b configured to accelerate or boost the turn-off time of the transistor 10. Thus, the switch-off driver 16b supplements the turn-off function of the primary driver 16a by implementing a faster switching speed than the primary driver 16a.

The control signal 13 for changing the switching state of the transistor 10 is processed by the evaluation unit 14. The evaluation unit 14 may be a fast FPGA or other gate driver controller that controls the gate driver stages of the multistage gate driver 16. The evaluation unit 14 generates driver control signals 15a and 15b that control one of the respective drivers 16a and 16b. Thus, the turn-on and turn-off functionality for transistor 10 driven by the drivers 16a and 16b can be activated and deactivated according to these control signals 15a and 15b. Each of the drivers 16a and 16b is configured to generate a low (negative) control voltage or high (positive) control voltage based on their respective driver control signals 15a and 15b to control the flow of gate current at the power transistor 10.

The primary driver 16a is electrically coupled to very large series resistor R1 and controls slow switching of the transistor 10. The current path of resistor R1 is bidirectional and is used to conduct a gate current IG during both turn-on and turn-off of the transistor. Thus, the gate current IG through resistor R1 contributes to the gate current Io+ during turn-on and contributes to gate current Io− during turn-off.

The series resistor R1 should preferably be selected at least so large that the switching process fulfills the conflict of objectives at every operation point vector of the planned operating range. The series resistor R1 with a high value must therefore ensure that a switching process meets oscillation criterion/criterial for all operation point vectors. The oscillation criterion/criteria may mean that the drain-source voltage VDS of the transistor 10, the drain current iD of the transistor 10, and/or a time derivative of the drain current diD/dt of the transistor 10 has no oscillation, has substantially no oscillation, or has oscillation that is within a tolerance limit that does not exceed an overvoltage or overshoot threshold for VDS of the transistor 10. For example, oscillation criterion/criteria may result in a 90% reduction of the oscillation amplitude (peak to peak).

The primary driver 16a is also electrically coupled to a smaller series resistor R2 that controls faster on switching of the transistor 10. The smaller series resistor R2 is coupled in parallel to resistor R1 and also in series with directional diode D1. The directional diode D1 allows current to flow to the gate or the transistor 10 but blocks current in the opposite direction. Hence, the current path of the series resistor R2 does not participate in the turn-off control of the transistor 10. Here, the resistance value of the series resistor R2 may be selected according to the switching speed provided by the primary driver 16a. In general, the series resistor R2 enables a higher gate current Io+ to flow to the gate of the transistor 10, resulting in accelerated gate charging and shorter turn-on times. In particular, the current path of the series resistor R2 contributes a boost-on current IGon to the gate current Io+ during the turn-on of the transistor 10. The switching is accelerated by the lower resistance path provided by resistor R2.

The turn-off driver 16b is electrically coupled to a directional diode D2 and a series resistor R3 and controls a faster turn-off switching of the transistor 10. The directional diode D2 allows a boost-off current IGoff to sink from the gate of the transistor 10 but blocks current in the opposite direction.

Here, the resistance value of the series resistor R3 may be selected according to the switching speed provided by the turn-off driver 16b. In general, the series resistor R3 enables a higher gate current Io- to be drawn from the gate of the transistor 10, resulting in accelerated gate discharging and shorter turn-off times. The turn-off driver 16b is only activated when the transistor 10 is acting as the passive transistor of the complementary transistor pair and the other transistor (not illustrated in FIG. 2A) is acting as the active transistor.

Turning to FIG. 2D, the switch-off driver 16b is considered off when it produces a high (H) control voltage and is considered on when it produces a low (L) control voltage, which may be negative. The low control voltage at the switch-off driver 16b results in a current being sinked through diode D2 from the gate of transistor 10. Similarly, the primary driver 16a sinks a portion of the turn-off current through resistor R1 by driving its control voltage low (negative) during turn-off of transistor 10. The low control voltages are set so that they are at a lower potential than the gate voltage, which causes the turn-off currents to flow from the gate towards the driver and causes the gate voltage to drop—resulting in transistor 10 being turned off.

To optimize the conflict of objectives, the switch-off driver 16b is briefly switched on during the switch-off process. While the switch-off driver 16b is switched on, the switch-off driver 16b generates a boost pulse BP at its output (i.e., a pulse of a low (negative) control voltage), as shown in FIG. 2D. This leads to an acceleration of the switch-off process, since switching is accelerated by the lower resistance. In particular, the evaluation unit 14 switches to a low (negative) control voltage via control signals 15a and 15b for the primary driver 16a and for the turn-off driver 16b. As a result of the two drivers 16a and 16b generating a low (negative) control voltage, both the primary driver 16a and the turn-off driver 16b sink gate current from the transistor 10 to turn off the transistor 10. The primary driver 16a maintains this low (negative) voltage level to sink gate current and/or maintain the transistor 10 in the off state until the control signal 13 initiates a turn-on switching event.

A boost duration TB is determined by the evaluation unit 14 by evaluating the passive transistor during its turn-off. Once the boost duration TB of the switching acceleration has lapsed, the evaluation unit 14 switches the turn-off driver 16b to a high (positive) control voltage via control signal 15b, ending the boost pulse BP according to the controlled boost duration TB. Once the control voltage at the turn-off driver 16b is switched positive, the directional diode D3 becomes reverse-biased and prevents further current flow (sink) to the turn-off driver 16b, so that it no longer participates in the turn-off switching process. In other words, the turn-off switching process is braked to the speed of the control of the primary driver 16a once the turn-off driver 16b is deactivated.

If the evaluation unit 14 has set the boost duration TB of the acceleration correctly according to the operation point vector of the passive transistor 10, a fast switching process can be achieved that meets oscillation criterion of the active transistor (i.e., has no oscillation, has substantially no oscillation, or has oscillation that is within a tolerance limit that does not exceed an overvoltage or an overshoot threshold for VD S of the active transistor). On the other hand, if oscillation in the switching current of the passive transistor is detected by the evaluation unit 14, the evaluation unit 14 can adjust to the acceleration duration TB such that the oscillation criterion is satisfied at a subsequent turn-off switching event. In fact, the oscillation criterion for both the active transistor and the passive transistor can be satisfied by monitoring the passive transistor during its turn-off.

Thus, after the turn-off switching process of the passive transistor, the evaluation unit 14 evaluates the time derivative switching current diD/dt against an oscillation criterion (e.g., against an oscillation threshold value). In order to obtain the time derivative switching current diD/dt, a comparator 19 implemented as part of the feedback circuit 18 receives a voltage drop $\Delta V$ (i.e., voltage difference VL) and compares the voltage drop $\Delta V$ to an oscillation threshold value. A voltage drop $\Delta V$ across a stray inductance L that is coupled in series with the passive transistor along its load path may be used as a representation of the time derivative switching current diD/dt. In actuality, the stray inductance may be formed by virtue of the wiring from the source pad of the transistor 10 to the source pin of the transistor 10.

If the voltage drop $\Delta V$ crosses (e.g., equals or exceeds) the predetermined oscillation threshold value during an oscillation monitoring period, the comparator 19 is configured to output a signal that indicates that the oscillation threshold has been crossed which further indicates that the oscillation criterion has not be met. Exceeding a threshold could mean, for example, that a measured value becomes more negative than a negative threshold or more positive than a positive threshold. The direction from which $\Delta V$ passes the oscillation threshold value is predetermined based on the configuration of the measurement circuit. Typically, the first oscillation undershoot or overshoot of di/dt within the dv/dt phase of the passive transistor during its turn-off has the largest magnitude and is a good indicator of whether an oscillation that exceeds the oscillation limit is present.

In FIG. 2A, the comparator 19 measures and/or receives a voltage drop $\Delta V$ across a stray inductance L that is coupled in series with the transistor 10 along its load path. In particular, the stray inductance L is coupled to a load path terminal of the transistor 10, such as the source terminal. The stray inductance L may be, for example, a wire (e.g., bond wire or printed circuit board conductor line) that acts as a stray inductor.

The comparator 19 receives the voltage drop $\Delta V$ and a predetermined oscillation threshold value Ref1 and generates a comparator output signal that indicates whether or not the instantaneous voltage difference or voltage drop $\Delta V$ across the stray inductance L has crossed the predetermined oscillation threshold value Ref1 during an oscillation monitoring period. The predetermined oscillation threshold value Ref1 can be provided as a reference voltage from a reference voltage source and can be set based on the known inductance value of the stray inductance L.

Alternatively, the evaluation unit 14 may receive the instantaneous voltage drop $\Delta V$ across the stray inductance L and calculate the instantaneous rate of current change diD/dt (amps per second) based on the instantaneous voltage drop $\Delta V$ and the known, pre-stored value of the stray inductance L to compare to a predetermined oscillation threshold value. Thus, the feedback circuit 18 as part of the control circuitry and shown in FIG. 1 includes at least the stray inductance L, the comparator 19, and part of the evaluation unit 14 (i.e., a signal processing circuit) used to evaluate the comparator result. The evaluation unit 14 may also be used to calculate the time derivative of the switching current diD/dt. The feedback circuit 18 may also be integrated with the evaluation unit 14.

Thus, the comparator 19 or the evaluation unit 14 evaluates the time derivative of the switching current diD/dt (or $\Delta V$) against the oscillation criterion. However, depending on the clock frequency of the application, it may not be time-critical. For example, with a high switching frequency of 40 kHz of the power transistor 10, the evaluation must be done within 25 μs and with lower clock frequencies the time available increases accordingly. Based on the evaluation, the evaluation unit 14 regulates the duration TB of the switching acceleration for the next turn-off switching event (i.e., the amount of time the turn-off driver 16b is activated or the amount of time the turn-off driver 16b generates a negative control voltage at the cathode of the directional diode D3 before switching back to a positive control voltage at the cathode).

This regulation of the duration TB of the switching acceleration includes maintaining a current duration setting if the time derivative switching current diD/dt (or ΔV) meets the oscillation criterion or adjusting (e.g., decreasing) the duration setting if the time derivative switching current diD/dt (or ΔV) does not meet or exceeds the oscillation criterion. For example, if the voltage drop ΔV crosses the predetermined oscillation threshold value Ref1 during an oscillation monitoring period, the time derivative switching current diD/dt does not meet the oscillation criterion. Alternatively, the evaluation unit 14 may adjust the duration setting by increasing the duration if the time derivative of the switching current diD/dt meets the oscillation criterion. For example, if the voltage drop ΔV does not cross the predetermined oscillation threshold value Ref1 during the oscillation monitoring period, the time derivative of the switching current diD/dt meets the oscillation criterion. In this way, by incrementally increasing the duration setting if the oscillation criterion is met and incrementally decreasing the boost duration setting of BP if the oscillation criterion is not met, an upper limit to the boost duration setting can be found based on a measurement of the operation point vector taken in real-time.

The oscillation monitoring period may be defined by one or more conditions being met, which will be further described in reference to FIGS. 4A-4E. In some cases, a second comparator 20 may be used to trigger the oscillation monitoring period by comparing the voltage drop ΔV to a monitoring threshold value Ref2 supplied by another voltage source. The comparator 20 may be configured to trigger the oscillation monitoring period upon detecting a crossing of the voltage drop ΔV against the monitoring threshold value Ref2 in addition to one or more conditions being satisfied.

In FIG. 2B, the feedback circuit 18 includes a capacitor C and a series resistor R circuit that is coupled in parallel to the transistor 10. Here, the comparator 19 implemented as part of the feedback circuit 18 measures a voltage drop ΔV across the resistor R. The voltage drop ΔV represents a time derivative of a voltage across the transistor 10 during the first turn-off switching event and is used by the feedback circuit 18 and the evaluation unit 14 in a similar manner described herein. The time derivative of the voltage across the passive transistor may be used for evaluating oscillations instead of the time derivative of the switching current of the passive transistor.

In FIG. 2C, the feedback circuit 18 includes a voltage divider comprising resistors R1 and R2. The voltage divider is coupled in parallel to the transistor 10. Here, the comparator 19 implemented as part of the feedback circuit 18 measures a voltage drop ΔV across the resistor R2. The voltage drop ΔV represents a time derivative of a voltage across the transistor 10 during the first turn-off switching event and is used by the feedback circuit 18 and the evaluation unit 14 in a similar manner described herein. The time derivative of the voltage across the passive transistor may be used for evaluating oscillations instead of the time derivative of the switching current of the passive transistor.

Figure 3A:
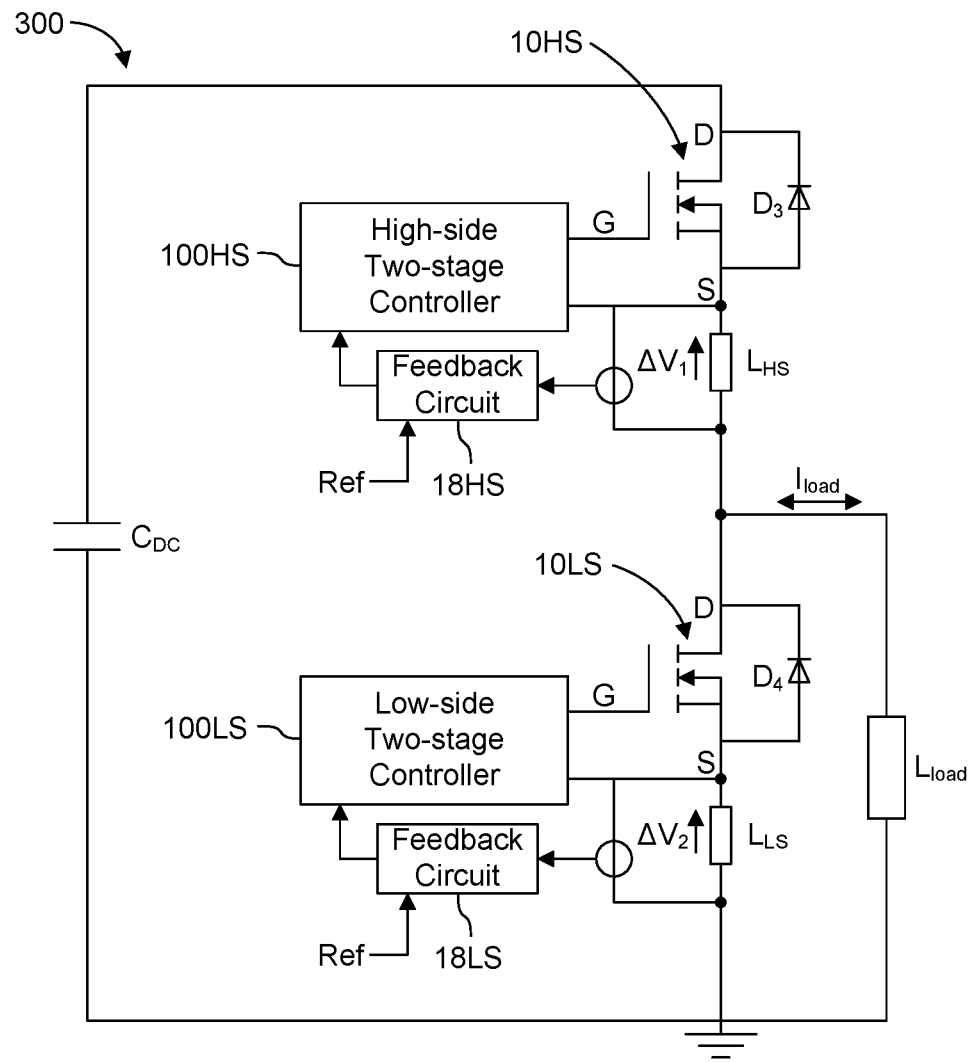
FIG. 3A is a schematic diagram of a load driving system including gate driver systems used to drive a complementary pair of power transistors according to one or more embodiments.

FIG. 3A is a schematic diagram of a load driving system 300 including gate driver systems used to drive a complementary pair of power transistors according to one or more embodiments. In particular, the load driving system 300 drives an inductive load Lload by sourcing and sinking a load current Iload. The load driving system 300 includes a high-side transistor 10HS and a low-side transistor 10LS connected in a half-bridge and that are driven by their respective high-side and low-side two stage controllers 100HS and 100LS. The high-side and low-side two stage controllers 100HS and 100LS both include circuitry of the gate driver system 100 described in conjunction with FIG. 1. In particular, both two stage controllers 100HS and 100LS include a controller 12, an FPGA 14, and a multistage gate driver 16. In some cases, the controllers 12 of the two stage controllers 100HS and 100LS can be combined.

Both two stage controllers 100HS and 100LS evaluate the oscillation of their respective transistor when the transistor is acting as the passive transistor in the complementary transistor pair. Thus, the two stage controller 100HS evaluates the time derivative switching current diD/dt (e.g., ΔV) of transistor 10HS against the oscillation criterion when it is being turned off as the passive transistor and adjusts its boost duration TB for the next turn-off switching event of the transistor 10HS based on the evaluation. Similarly, the two stage controller 100LS evaluates the time derivative switching current diD/dt (e.g., ΔV) of transistor 10LS against the oscillation criterion when it is being turned off as the passive transistor and adjusts its boost duration TB for the next turn-off switching event of the transistor 10LS based on the evaluation. Thus, two different boost durations TB are being monitored and regulated by the respective two stage controllers 100HS and 100LS. By doing so, the oscillation in the switching current (i.e., the drain current) of the active transistor can be regulated during its turn-on to a desired limit or prevented altogether, thereby preventing switching losses in the active transistor.

The power transistors 10Hs and 10LS are connected in a half-bridge configuration and coupled to a DC power supply CDC. In addition, each transistor 10HS and 10LS has a freewheeling diode D3 or D4 coupled across its load terminals (e.g., drain and source terminals). Each transistor 10HS and 10LS has a stray inductor LHS or LLS connected in series, as similarly presented in FIG. 2A, for measuring diD/dt (e.g., ΔV) to be evaluated by its comparator 19 or its evaluation unit 14 during a turn-off switching event. In particular, feedback circuits 18HS and 18LS are configured to measure the instantaneous voltage drop ΔV1 or ΔV2 across their respective stray inductors LHS and LLS for comparison to a predetermined oscillation threshold value Ref1.

Figure 3B:
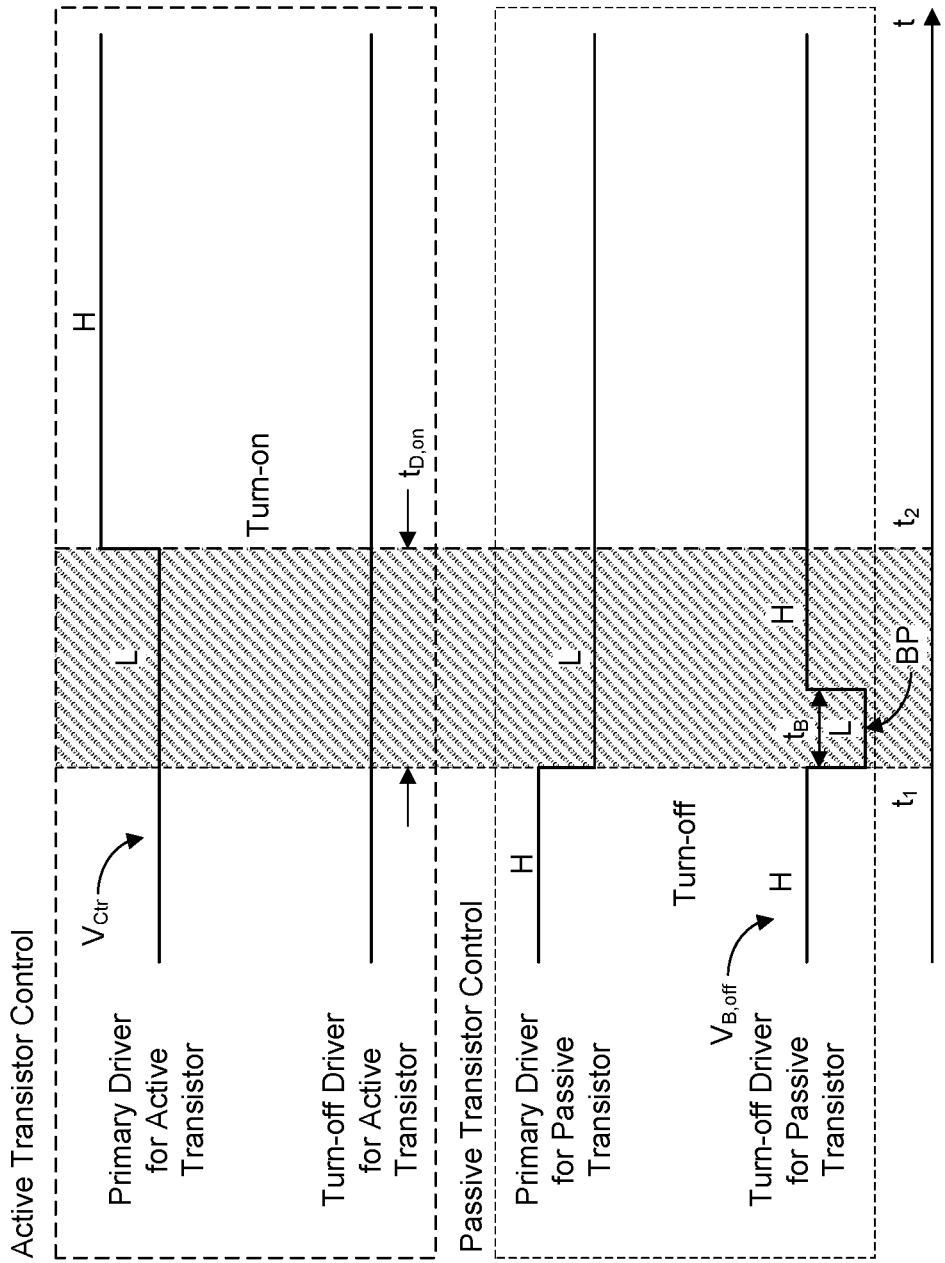
FIG. 3B is a waveform diagram of a control voltages generated by the two stage controllers of the load driving system during turn-on of the active transistor and during turn-off of the passive transistor according to one or more embodiments.

FIG. 3B is a waveform diagram of control voltages generated by the two stage controllers 100HS and 100LS of the load driving system 300 during turn-on of the active transistor and during turn-off of the passive transistor. Here, a high signal level H corresponds to a positive control voltage generated by a gate driver and a low signal level L corresponds to a negative control voltage generated by a gate driver. The control signal generated by the primary driver 16a may be referred to as control voltage Vctr and the control signal generated by the turn-off driver 16b may be referred to as control voltage VB,off.

At time t1, the passive transistor is switched off by driving both the primary driver 16a and the turn-off driver 16b of the passive transistor low such that they generate a negative control voltage. The turn-off driver 16b of the passive transistor generates its negative control voltage as boost pulse BP for boost duration TB before switching back to a positive control voltage.

After a set dead time tD,on following the turn-off time t1, the active switch is turned on at time t2. Accordingly, the output voltage of the primary driver 16a of the active switch is switched high to the positive control voltage. Current flow across the series resistor R2, which is much smaller than R1, is possible with respect to the directional diode D1 when the output voltage of the primary driver 16a for the active transistor is the positive control voltage. Thus, the gate capacitance charging is accelerated. This two-stage driving realizes the turn-off operation of the passive transistor with two different gate capacitance discharge rates and the turn-on operation of the active switch with a single fast gate capacitance charge rate.

Figure 4A:
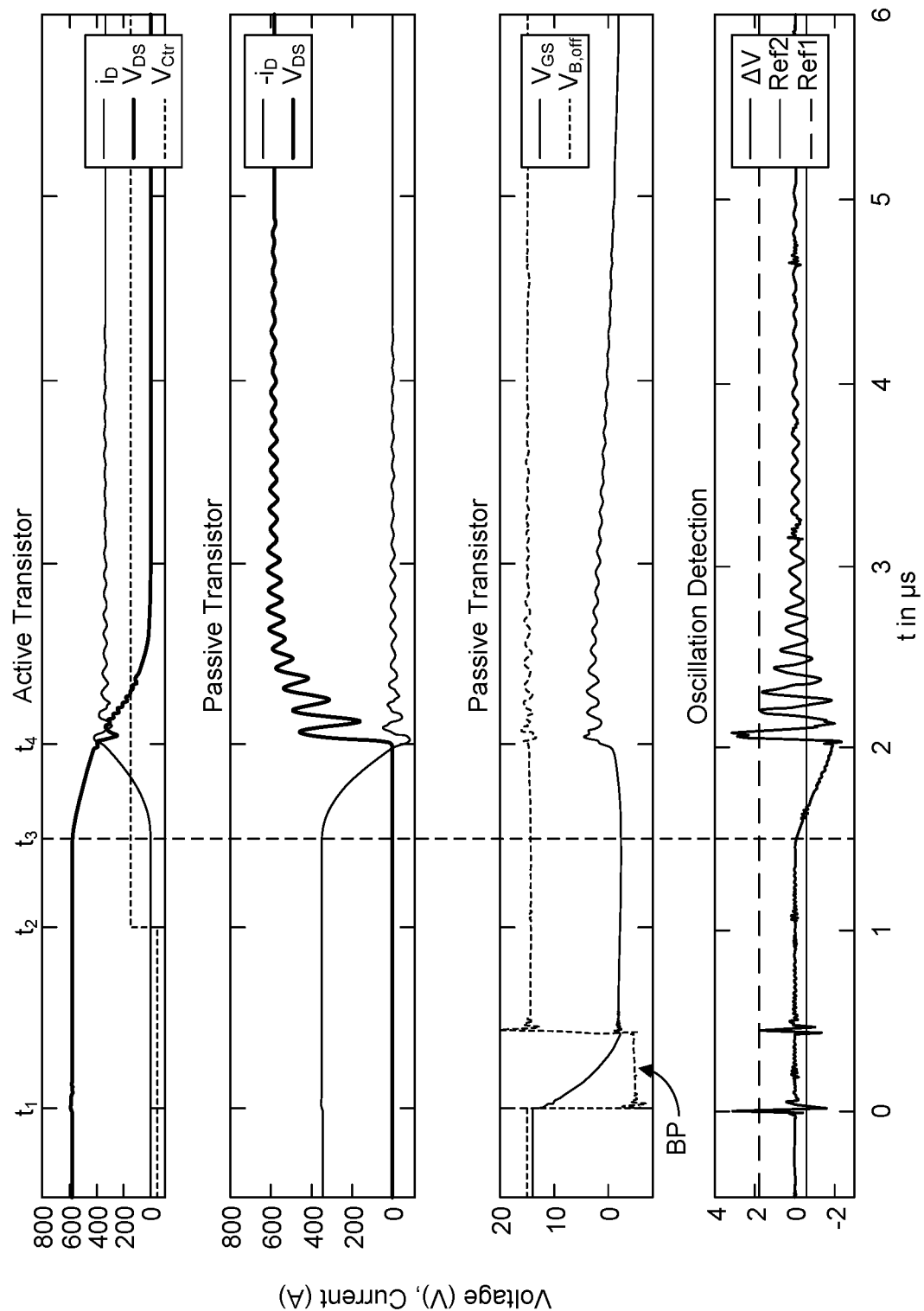
FIG. 4A shows normalized current, voltage, and control waveforms for the active and passive transistors during turn-off of the passive transistor and during turn-on of the active transistor.

FIG. 4A shows normalized current, voltage, and control waveforms for the active and passive transistors during turn-off of the passive transistor and during turn-on of the active transistor. In particular, the drain current iD, and the drain-source voltage VDS are shown for both active and passive transistors, as well as the control signals Vctr and VB,off, the gate-source voltage VGS of the passive transistor, and a representation of the time derivative switching current diD/dt (e.g., ΔV) of the passive transistor that is evaluated against an oscillation criterion that includes comparing ΔV to the oscillation threshold value Ref1.

In FIG. 4A, a boost pulse BP having a longer boost duration TB is used, which results in oscillations in the drain current of the active and passive transistors, in the drain-source voltage VDS of the passive transistor, and in the gate-source voltage VGS of the passive transistor. This results in fast switching for turn-off of the passive power transistor without regulating a switching acceleration duration TB based on a measured operation point vector. Here, pure-ohmic switching process with low switching loss is used. Thus, the switching process is fast and makes optimal use of the electrical capabilities of the passive power transistor, but leads to large oscillations.

Figure 4B:
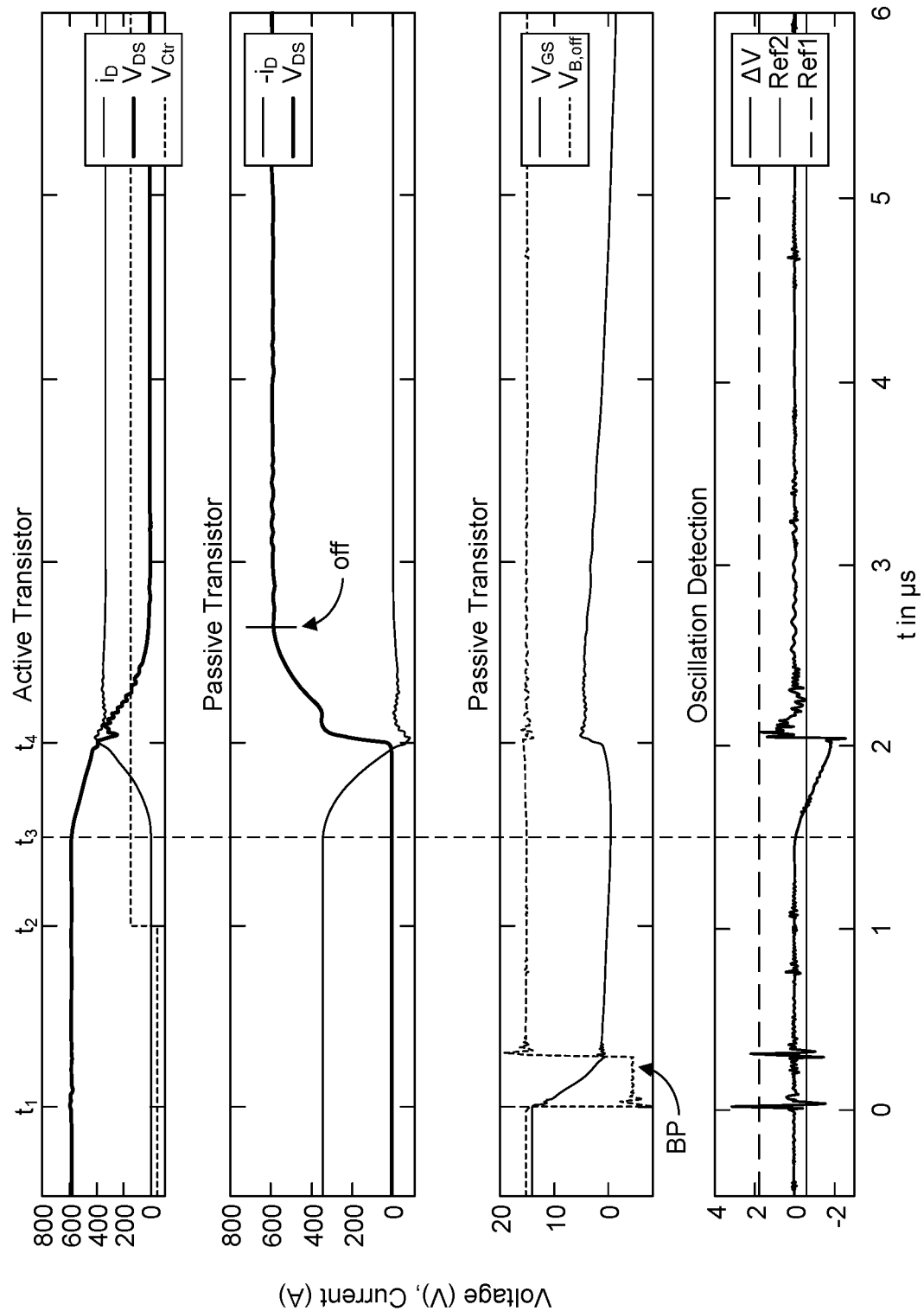
FIG. 4B directed to a turn-off switching event of a passive transistor and a turn-on switching event of an active transistor and illustrates normalized current, voltage, and control waveforms for the active and passive transistors for these events while using fast switching and a regulated acceleration duration TB according to one or more embodiments.

FIG. 4B is directed to a turn-off switching event of a passive transistor and a turn-on switching event of an active transistor and illustrates normalized current, voltage, and control waveforms for the active and passive transistors for these events while using fast switching and a regulated acceleration duration TB according to one or more embodiments. In FIG. 4B, a boost pulse BP having a regulated boost duration TB is used, which results in little to no oscillations in the drain current of the active and passive transistors, in the drain-source voltage VDS of the passive transistor, and in the gate-source voltage VGS of the passive transistor. The regulated boost duration TB depicted in FIG. 4B is shorter than the unregulated boost duration TB depicted in FIG. 4A.

It is to be noted in FIG. 4B that ΔV does not cross the oscillation threshold value Ref1 during an oscillation monitoring period and thus indicates that the oscillation criterion has been met. When there is no detected violation of the oscillation criterion, the evaluation unit 14 ends the oscillation monitoring period when the turn-off transition of the passive transistor is over, which occurs when its drain-source voltage VDS reaches a stable maximum.

When switching half-bridges, the drain-source voltage VDS and the drain current iD of the passive transistor can also experience oscillation when turning on the active transistor. The size of the oscillation of the drain-source voltage VDS or the drain current iD of the passive transistor can be correlated (e.g., proportional) to the size of the oscillation of the drain current iD at the active transistor and vice versa. For example, a large oscillation in the drain-source voltage VDS or the drain current iD of the passive transistor is indicative of a large oscillation in the drain current iD of the active transistor, meanwhile smaller or no oscillations in the drain-source voltage VDS or the drain current iD of the passive transistor is indicative of smaller or no oscillations in the drain current iD of the active transistor.

Additionally, the drain-source voltage VDS or the drain current iD of the passive transistor can be monitored and evaluated to determine whether there is an oscillation at the active transistor that violates the oscillation criterion. For example, the drain-source voltage VDS of the passive transistor, the drain current iD of the passive transistor, or the time derivative of VDS or iD of the passive transistor can be evaluated against a respective threshold limit or a respective tolerance window as the oscillation criteria for the active transistor. If the drain-source voltage VDS of the passive transistor, the drain current iD of the passive transistor, or the time derivative of the VDS or iD of the passive transistor is detected to cross its respective threshold limit or a respective tolerance window, the evaluation circuit 14 can detect that unacceptable oscillation has occurred at the active transistor during its turn on switching event. In other words, a large oscillation can be detected at the passive transistor during the turn-on of the active transistor. From this oscillation detection at the passive transistor during its turn-off, it can be inferred that a large oscillation in iD has occurred at the active transistor during the turn-on of the active transistor.

A comparison between the unregulated and regulated acceleration duration TB depicted in FIGS. 4A and 4B is described as follows with the two switching operations of the active and passive transistors starting from the switch-off time of the passive transistor t1 At time t1, the passive transistor is turned off. Since at this time the load current flows through the load and the freewheeling diode of the passive transistor, the voltage VDS and current iD waveforms of the two transistors are not affected. This turn-off operation of the passive transistor is therefore referred to as "passive turn-off". The discharge process of the gate capacitance of the passive transistor (i.e., of the gate-source voltage VGS) is exponential according to an RC circuit. The gate voltage does not exhibit a Miller plateau.

After a predefined dead time tD,on following the passive transistor turn-off time t1, the active transistor is turned on at time t2. When the gate capacitance of the active transistor is charged up to its threshold voltage at time t3, the active transistor starts conducting and the di/dt phase of the turn-on process for the active transistor begins, during which the switching current commutates from the passive switch to the active switch. In other words, the drain current iD of the active switch beings to increase at time t3 and the drain current iD of the passive switch begins to decrease at time t3. The drain-source voltage VDS of the active transistor also begins to decrease at time t3. The time derivative switching current diD/dt of the passive transistor also starts to decrease at time t3, becoming negative. During the current commutation between times t3 and t4, the passive transistor remains de-energized. The current commutation is completed when the drain current iD of the passive switch crosses zero, which occurs at time t4 and demarks the start of the dv/dt phase of the switch-on process. At this time, the passive transistor takes over the voltage of the active transistor and the drain-source voltage VDS of the passive transistor begins to increase. The positive dVDS/dt of the passive transistor in this phase results in a displacement current across the Miller capacitance (CGD), which charges the gate capacitance (CGS). When this displacement current causes the gate voltage of the passive transistor to cross its threshold voltage again, a small current flow of the channel is possible according to the transfer characteristic of the passive transistor. This results in a momentary cross current across both transistors. This effect is usually referred to as a phase short circuit. However, the low current and low duration of this short circuit should be strictly noted. The phenomenon is the so-called parasitic turn-on (PTO), which is undesirable.

The switching operation shown in FIG. 4A exhibits high oscillation but no PTO. The boost duration TB of this switching operation is longer than that of the switching operation in FIG. 4B. The accelerated discharge of the gate capacitance in FIG. 4A lasts longer due to the longer boost duration TB and the gate voltage of the passive transistor at time t4 is lower. Thus, the required Miller charge leading to the occurrence of a PTO is higher. The gate voltage at time t4 can be adjusted by the boost duration TB. When the boost duration TB becomes shorter, as in FIG. 4B, the duration of the accelerated discharge of the gate capacitance is shorter and the gate voltage of the passive transistor at time t4 is higher. The Miller charge required for a PTO to occur is reduced, as shown by the switching operation shown with solid curves. It can be seen that during the switching operation with PTO, the overvoltage and the voltage oscillation of the passive transistor almost disappear.

Since the time derivative switching current diD/dt (e.g., $\Delta V$) of the passive transistor is proportional to the oscillation, this signal can be used to evaluate the oscillation in the embodiments described herein and regulate the boost duration TB to reduce or eliminate the oscillation. According to diD/dt=$\Delta V$/L, the time derivative switching current diD/dt of the passive switch is proportional to the inductor voltage drop $\Delta V$ (i.e., $\Delta V1$ or $\Delta V2$ depending on which transistor is the acting as the passive transistor) across the corresponding stray inductor LHS or LLS of the passive transistor, which can be measured in the manner described above.

While the measured voltage drop $\Delta V$ is shown in FIGS. 4A and 4B, it is also conceivable that the measured voltage drop $\Delta V$ can be converted to a time derivative switching current diD/dt and that the time derivative switching current diD/dt can be compared to a corresponding negative threshold for detecting oscillation.

Figure 4C:
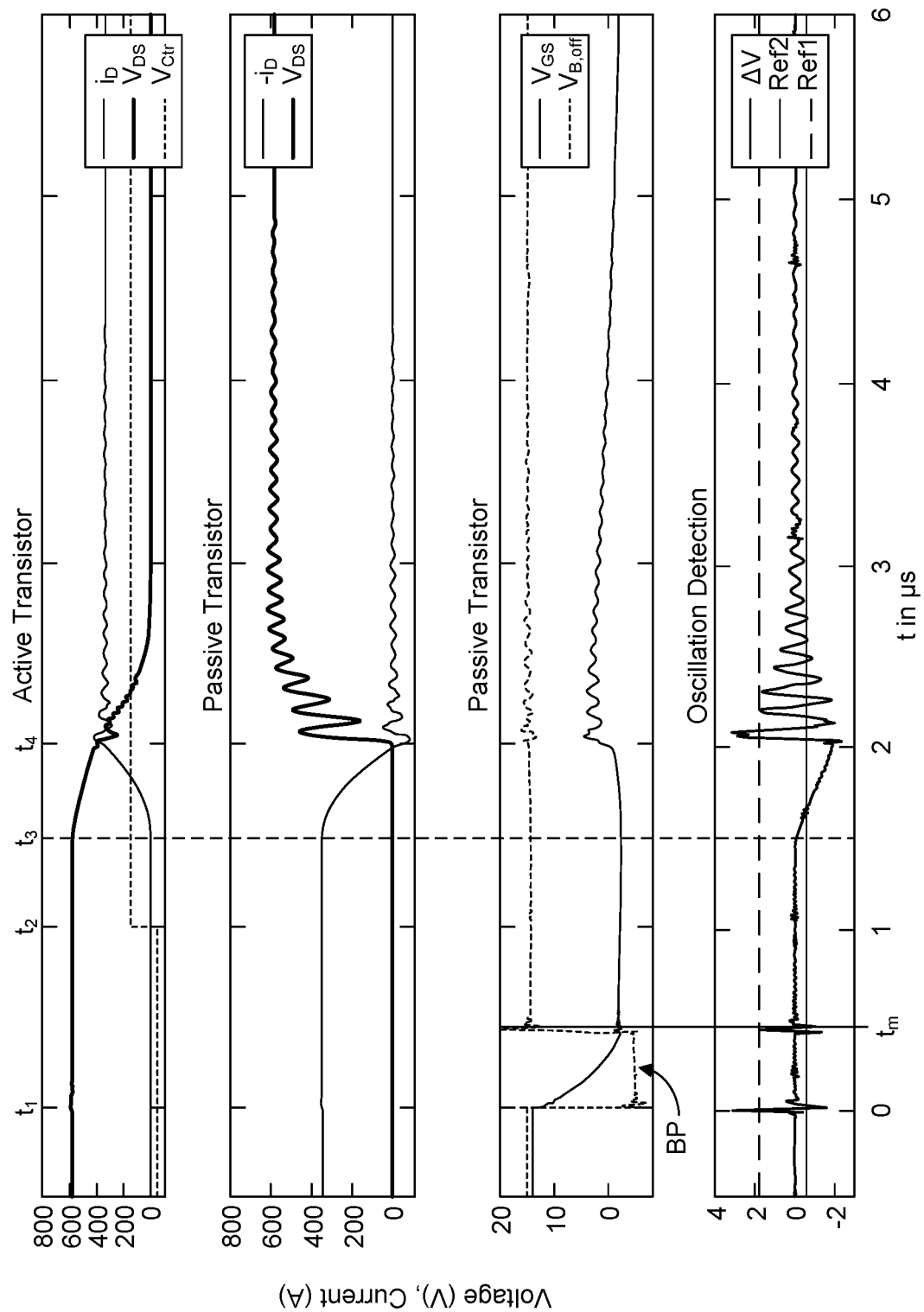
FIGS. 4C-4E illustrate various methods for triggering an oscillation monitoring period during which a time derivative switching current diD/dt of a passive transistor is evaluated for a crossing of an oscillation threshold value according to one or more embodiments.
Figure 4D:
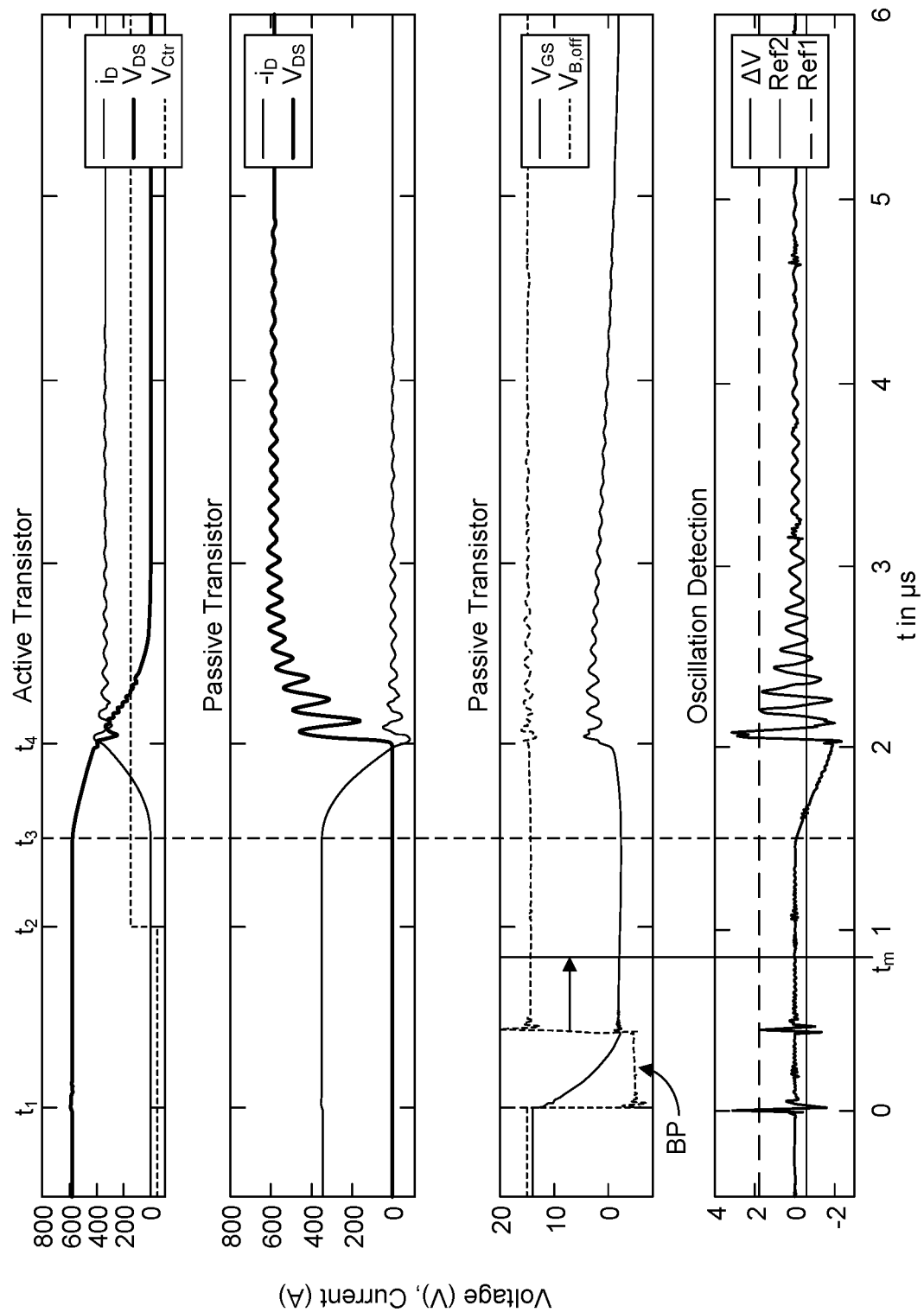
Figure 4E:
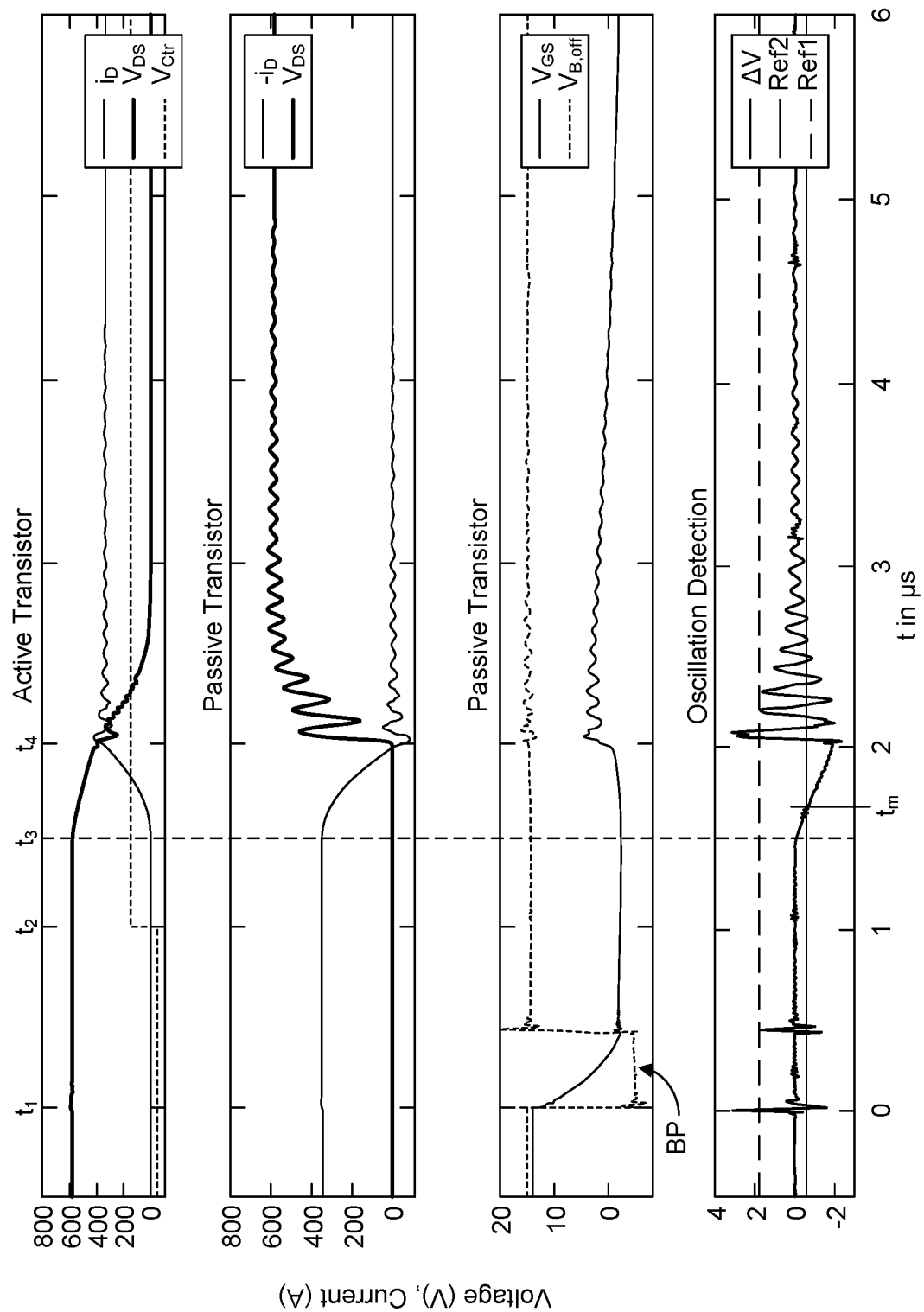

FIGS. 4C-4E illustrate various methods for triggering the oscillation monitoring period during which the time derivative switching current diD/dt of the passive transistor (e.g., $\Delta V$) is evaluated for a crossing of the oscillation threshold value Ref1. The oscillation monitoring period is intended to be set such that glitches or false detections of a threshold crossing are suppressed. For example, oscillations in $\Delta V$ that may cross the oscillation threshold value Ref1 during transition edges of the boost pulse BP can be ignored by ensuring that the oscillation monitoring period starts after the boost pulse BP has ended. Small glitches in $\Delta V$ that may occur between the boost pulse BP and the time the drain-source voltage VDS of the passive transistor starts to take over at time t4 may also be ignored either by the setting of oscillation threshold value Ref1 or by regulating the trigger time of the oscillation monitoring period. The trigger time (i.e., start time) of the oscillation monitoring period is denoted tm.

In FIG. 4C, the oscillation monitoring period starts after the second transient of the boost pulse BP. Said differently, the oscillation monitoring period starts after the boost interval of the boost pulse BP has expired. Since the evaluation unit 14 configures the duration of the boost interval, the expiration time of the boost interval is known to the evaluation unit 14. Thus, the evaluation unit 14 can begin evaluating $\Delta V$ starting at time tm, may enable comparator 19 at time tm to enable the evaluation of $\Delta V$ against the oscillation threshold value Ref1, or may enable the evaluation of the output of comparator 19 at time tm. When $\Delta V$ increases due to an oscillation at the passive transistor and crosses a positive oscillation threshold value Ref1, an oscillation is detected and the oscillation monitoring period ends.

In FIG. 4D, the oscillation monitoring period again starts after the second transient of the boost pulse BP. However, in this case, the evaluation unit 14 sets the starting at time tm to be a fixed time interval after the boost interval of the boost pulse BP has expired. In other words, the evaluation unit 14 initiates the oscillation monitoring period after an expiration of a predetermined time interval that follows the boost interval with the predetermined time interval starting at an expiration of the boost interval. Thus, the evaluation unit 14 can begin evaluating $\Delta V$ starting at time tm, may enable comparator 19 at time tm to enable the evaluation of $\Delta V$ against the oscillation threshold value Ref1, or may enable the evaluation of the output of comparator 19 at time tm. When $\Delta V$ increases due to an oscillation at the passive transistor and crosses a positive oscillation threshold value Ref1, an oscillation is detected and the oscillation monitoring period ends.

In FIG. 4E, the oscillation monitoring period again starts after the second transient of the boost pulse BP. However, in this case, the evaluation unit 14 triggers the starting at time tm at a time when $\Delta V$ crosses (e.g., becomes equal to or more negative than) the monitoring threshold value Ref2. In particular, the drop in drain current at the passive transistor due to turn-off leads to a negative $\Delta V$ starting at time t3. When $\Delta V$ drops below a non-zero, negative monitoring threshold value Ref2 at time tm, the evaluation unit 14 triggers the oscillation monitoring period. The evaluation of $\Delta V$ against the monitoring threshold value Ref2 is only active if the condition set in FIG. 4C or FIG. 4D for time tm is met so that glitches in $\Delta V$ can be suppressed. Thus, the evaluation unit 14 triggers the oscillation monitoring period after an expiration of the boost interval and when the $\Delta V$ crosses the monitoring threshold value Ref2. When $\Delta V$ increases due to an oscillation at the passive transistor and crosses a positive oscillation threshold value Ref1, an oscillation is detected and the oscillation monitoring period.

In all cases, the evaluation unit 14 is configured to compare the voltage drop signal $\Delta V$ subsequent to an expiration of the boost interval of the boost pulse BP to determine whether an (unsatisfactory) oscillation has occurred during the oscillation monitoring period. If no unsatisfactory oscillation is detected during the oscillation monitoring period, the evaluation unit 14 determines that the voltage drop signal $\Delta V$ or the time derivative switching current diD/dt of the passive transistor meets the oscillation criterion to a satisfactory degree.

A turn-on of the active transistor is considered to be free of oscillation if $\Delta V$ of the passive transistor does not cross the oscillation threshold value Ref1 at any point during the oscillation monitoring period. The maximum boost time TB with which the switching process is still oscillation-free is defined as the optimum boost time and may be defined to occur, for example, when the peak of the first oscillation overshoot or undershoot of the voltage drop signal $\Delta V$ comes within a predefined margin of the oscillation threshold value Ref1 but does not cross the oscillation threshold value Ref1. If "crossing" the threshold is interpreted as exceeding the threshold, then the optimum boost time occurs when the peak of the first oscillation overshoot or undershoot of the voltage drop signal $\Delta V$ exactly equals the oscillation threshold value Ref1. Since the voltage drop signal $\Delta V$ from the switching operation with PTO exactly reaches the oscillation threshold value Ref1, this boost time is the optimal boost time for this operating point.

It can be seen in FIG. 4B that the boost time TB must be set optimally to take advantage of the PTO effect and avoid increased power loss due to excessive PTO. Boost times that are too long lead to strong oscillation and boost times that are too short lead to increased phase short circuit. The influence of PTO on switching operation is strongly dependent on the operating point. This means that the optimum boost time changes with changing operating points. Therefore, an operating point-dependent control is necessary. The optimum boost time for reducing or avoiding oscillation during voltage pickup when the passive switch is passively switched off and at the same time only a small increase in loss energy can be approached in an operating point-dependent manner using the principle of tracking control described herein.

As noted above, the voltage drop signal $\Delta V$ or the time derivative switching current diD/dt is evaluated by the boost control circuit against a threshold limit to regulate the acceleration duration TB implemented by the turn-off driver 16b. The voltage drop signal $\Delta V$ is evaluated against an oscillation threshold value Ref1, which is a boundary that if crossed by the voltage drop signal $\Delta V$ during the oscillation monitoring period results in the occurrence of unacceptable oscillation. Thus, the threshold limit sets the oscillation criterion for the evaluation.

Therefore, it can be surmised that FIG. 4B illustrates a benefit of setting the duration TB of the switching acceleration depending on the operation point vector. A non-optimal boost duration TB results in either increased oscillation or a significantly slower switching speed.

The feedback circuit 18 is configured to evaluate the voltage drop signal $\Delta V$, as described above, during a current turn-off switching event of the passive transistor so that the next boost pulse for the next turn-off switching event of the same transistor can be adjusted if needed to optimize the boost pulse according to the operating point. The evaluation unit 14 uses the results of the evaluation to regulate the boost time TB for the next boost pulse corresponding to the next turn-off switching event of the passive transistor. By doing so, the evaluation unit 14 aims to reduce the oscillation of the drain-source voltage VDS, the drain-current iD, and the gate-source voltage VGS of the passive transistor, as well as reduce the oscillation of the drain-current iD of the active transistor.

Figure 5:
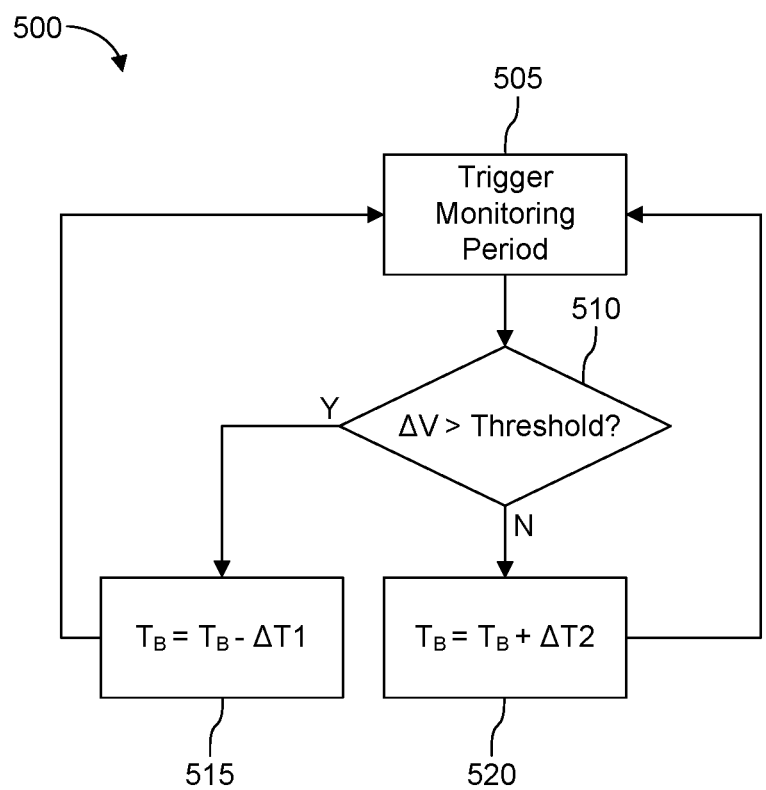
FIG. 5 is a flow diagram for a method of regulating a turn-off boost time TB according to one or more embodiments.

FIG. 5 is a flow diagram for a method 500 of regulating a turn-off boost time TB according to one or more embodiments. Increasing the boost time TB also increases the tendency for oscillation. Conversely, decreasing the boost time TB decreases the tendency for oscillation.

It is noted that, if oscillation or a ringing-effect in the drain-source voltage VDS and drain-current iD exists, the oscillation typically starts after the boost-phase is over and after the drain-current iD of the passive switch becomes zero. Thus, the evaluation unit 14 can set time tm in accordance with FIGS. 4C-4E to trigger the monitoring phase for detecting and/or measuring any oscillation that may be present. Upon detecting an oscillation that does not meet the oscillation criterion, further action by the evaluation unit 14 can be taken.

In operation 505, the evaluation unit 14 triggers the oscillation monitoring period at time tm. The feedback circuit 18 measures and evaluates the voltage drop signal $\Delta V$ or the time derivative switching current diD/dt against a threshold limit Ref1 (operation 510).

In this example, the comparator 19 measures and evaluates the voltage drop signal $\Delta V$ against the oscillation threshold value Ref1 (operation 510). In particular, in operation 510, the comparator 19 receives the voltage drop signal $\Delta V$ and compares it to oscillation threshold value Ref1. The evaluation can be performed over the oscillation monitoring period such that if at any time during the predetermined monitoring period the voltage drop signal $\Delta V$ crosses the oscillation threshold value Ref1, oscillation is detected. The monitoring period begins at time tm, as described above, and is long enough in duration to detect an oscillation, should it be present. At the end of the monitoring period, if no oscillation has been detected, the evaluation unit 14 can arrive at a "no oscillation" decision. Thus, the predetermined monitoring period provides an acceptable margin for the evaluation unit 14 to determine whether or not oscillation has occurred.

During the monitoring period, the feedback circuit 18 (e.g., comparator 19) compares the voltage drop signal $\Delta V$ to the oscillation threshold value Ref1. If the voltage drop signal $\Delta V$ crosses the oscillation threshold value Ref1 (Y), the boost time TB of the switching acceleration for the next passive turn-off switching operation for that transistor is reduced by a first adaptation time $\Delta T1$ of a first predetermined amount (operation 515). For example, the boost time TB is decreased in this example by 5 ns. On the other hand, if the voltage drop signal $\Delta V$ does not cross the oscillation threshold value Ref1 (N), the boost time TB of the switching acceleration for the next passive turn-off switching operation for that transistor is increased by a second adaptation time $\Delta T2$ of a second predetermined amount (operation 520). For example, the boost time TB is increased in this example by 5 ns. It will be appreciated that the first predetermined amount $\Delta T1$ and the second predetermined amount $\Delta T2$ may be equal or different amounts. Additionally, a higher adaptation time is conceivable, as is a reduced one.

After operation 515 or 520, the feedback circuit 18 waits for the next passive turn-off switching event and the method repeats. Thus, feedback circuit 18 evaluates a transistor parameter (e.g., the voltage drop signal $\Delta V$ or the time derivative switching current diD/dt of the passive transistor) indicative of an oscillation for the passive and/or active transistor during a current passive turn-off switching event in order to regulate the boost time TB implemented for the next passive turn-off switching event.

The transistor parameter is again evaluated during the next passive turn-off switching event to regulate the boost time TB implemented for the next subsequent passive turn-off switching event, and so on. Thus, the boost time TB may be adjusted for each subsequent passive turn-off switching event based on the evaluation performed in the passive turn-off switching event just prior thereto so that the boost time TB can be dynamically regulated according to the real-time operation point vector.

However, since the setting is always based on the switching process that took place previously, the set duration of the switching acceleration is not necessarily the ideal value. The set duration fluctuates much more within a tolerance band around the setpoint of the boost time TB. This setpoint should therefore be set so that the criteria of the conflicting target values are met within the resulting tolerance band.

A property of the method is the ability to be able to follow every change in the setpoint and thus the operation point vector. If this is not the case, a high rate of change of a parameter and thus a high rate of change of the target value could lead to the criteria of the target value conflict being exceeded.

One of the advantages of method 500 is that no prior knowledge of the operation point vector is required. No variables such as DC link voltage, temperature, or switching current have to be measured. Only the voltage drop ΔV or the time derivative switching current diD/dt based on Ohm's Law (diD/dt=ΔV/L) is measured. Therefore, it is not necessary to create a detailed description or listing for the operation point vector dependency of the boost time TB of the switching acceleration. This saves development effort and necessary hardware implementation in the application.

In addition, the discretization of the target value for the boost time TB can be set as finely as desired within certain limits, so that there is an optimal match between the set duration and the duration of the switching acceleration required for the respective operation point vector. This ensures that the target value criterion is met for the lowest switching losses that can be achieved. It is also important that parameter fluctuations that are always present do not cause any problems, since they are always adapted to the respective situation.

In addition, the oscillation amplitude of the turn-on process of the active transistor can be reduced if the PTO effect, which is usually considered harmful to semiconductor switches, is used in a controlled manner. Tracking control, based on normal two-stage control, is used to optimally adjust the operating point-dependent PTO effect.

In view of the above, method 500 enables a simple implementation of the cancellation of the target value conflict between the tendency to oscillate and the switching losses of SiC MOSFETs. It can be applied to possible realizations of a two-stage or multi-stage control of the SiC MOSFET.

Additional embodiments are provided below.

1. A gate driver system configured to drive a load, the gate driver system configured to drive a half bridge circuit comprising a first transistor and a second transistor that are switched in a complementary manner, the gate driver system comprising: a first gate driver circuit coupled to a first gate terminal of the first transistor and configured to control a first gate voltage at the first gate terminal in order to drive the first transistor between the switching states, the first gate driver circuit configured to generate a first on-current during a first plurality of turn-on switching events to turn on the first transistor; a second gate driver circuit coupled to a second gate terminal of the second transistor and configured to control a second gate voltage at the second gate terminal in order to drive the second transistor between the switching states, the second gate driver circuit configured to generate a first off-current during a first plurality of turn-off switching events to turn off the second transistor, wherein the second gate driver circuit includes a first driver configured to sink a first portion of the first off-current from the second gate terminal to discharge a first portion of the second gate voltage, wherein the second gate driver circuit includes a second driver configured to, during a first boost interval, sink a second portion of the first off-current from the second gate terminal to discharge a second portion of the second gate voltage; a first measurement circuit configured to measure a first transistor parameter of the second transistor during a first turn-off switching event during which the second transistor is transitioned to an off state, wherein the first transistor parameter is indicative of an oscillation at the first transistor during a corresponding first turn-on switching event during which the first transistor is transitioned to an on state; and at least one control circuit configured to control the first driver to sink the first portion of the first off-current and to control the second driver to sink the second portion of the first off-current, wherein the at least one control circuit is further configured to regulate a length of the first boost interval based on the measured first transistor parameter.

2. The gate driver system of embodiment 1, further comprising: a second measurement circuit configured to measure a second transistor parameter of the first transistor during a second turn-off switching event during which the first transistor is transitioned to an off state, wherein the second transistor parameter is indicative of an oscillation at the second transistor during a corresponding second turn-on switching event during which the second transistor is transitioned to an on state, wherein the first gate driver circuit is configured to generate a second off-current during a second plurality of turn-off switching events to turn off the first transistor, wherein the second gate driver circuit is configured to generate a second on-current during a second plurality of turn-on switching events to turn on the second transistor, wherein the first gate driver circuit includes a third driver configured to sink a first portion of the second off-current from the first gate terminal to discharge a first portion of the first gate voltage, wherein the first gate driver circuit includes a fourth driver configured to, during a second boost interval, sink a second portion of the second off-current from the first gate terminal to discharge a second portion of the first gate voltage, and wherein the at least one control circuit is configured to control the third driver to sink the first portion of the second off-current and to control the fourth driver to sink the second portion of the second off-current, wherein the at least one control circuit is further configured to regulate a length of the second boost interval based on the measured second transistor parameter.

While various embodiments have been disclosed, it will be apparent to those skilled in the art that various changes and modifications can be made which will achieve some of the advantages of the concepts disclosed herein without departing from the spirit and scope of the invention. For example, while is it noted that SiC MOSFETs generally switch so fast that oscillation is a recurring problem for SiC MOSFETs, embodiments may be applicable to any power semiconductor with a fast switching speed that encounters oscillation issues. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A method of driving a half bridge circuit comprising a first transistor and a second transistor, the method comprising:
   generating an off-current during a plurality of turn-off switching events to control a gate voltage at a gate terminal of the second transistor,
   wherein generating the off-current includes sinking a first portion of the off-current from the gate terminal to discharge a first portion of the gate voltage, and sinking, during a boost interval, a second portion of the off-current from the gate terminal to discharge a second portion of the gate voltage;
   measuring a transistor parameter of the second transistor during a first turn-off switching event during which the second transistor is transitioned to an off state, wherein the transistor parameter is indicative of an oscillation at the second transistor during a corresponding turn-on switching event during which the first transistor is transitioned to an on state;
   activating the first portion of the off-current for a second turn-off switching event during which the second transistor is transitioned to the off state; and
   activating the second portion of the off-current for the second turn-off switching event, including regulating a length of the boost interval for the second turn-off switching event based on the transistor parameter measured during the first turn-off switching event.

2. The method of claim 1, wherein the transistor parameter represents a time derivative of a load current of the second transistor during the first turn-off switching event.

3. The method of claim 1, wherein the transistor parameter represents a time derivative of a voltage across the second transistor during the first turn-off switching event.

4. The method of claim 1, further comprising:
   comparing the transistor parameter measured during the first turn-off switching event to an oscillation threshold to generate a comparison result; and
   regulating the length of the boost interval for the second turn-off switching event based on the comparison result.

5. The method of claim 4, further comprising:
   initiating a monitoring interval, wherein the transistor parameter is compared to the oscillation threshold during the monitoring interval.

6. The method of claim 5, wherein the monitoring interval is initiated starting at an expiration of the boost interval.

7. The method of claim 5, wherein the monitoring interval is initiated after an expiration of a time interval that follows the boost interval, the time interval starting at an expiration of the boost interval.

8. The method of claim 5, further comprising:
   comparing the transistor parameter to a monitoring threshold value,
   wherein the monitoring interval is initiated after an expiration of the boost interval and when the transistor parameter crosses the monitoring threshold value.

9. The method of claim 4, wherein:
   the comparison result indicates whether or not the transistor parameter exceeds the oscillation threshold,
   on a first condition that the transistor parameter exceeds the oscillation threshold, regulating the length of the boost interval for the second turn-off switching event includes decreasing the length of the boost interval for the second turn-off switching event, and
   on a second condition that the transistor parameter does not exceed the oscillation threshold, regulating the length of the boost interval for the second turn-off switching event includes increasing the length of the boost interval for the second turn-off switching event.

10. The method of claim 1, wherein driving the half bridge circuit comprises switching the first transistor and the second transistor in a complementary manner.

11. The method of claim 1, wherein activating the second portion of the off-current for the second turn-off switching event includes activating a flow of the second portion of the off-current at a start of the boost interval for the length of the boost interval and deactivating the flow of the second portion of the off-current at an end of the boost interval to stop the flow of the second portion of the off-current.

12. The method of claim 1, wherein the transistor parameter is a time derivative of a load current of the second transistor or the transistor parameter is proportional to the time derivative of the load current of the second transistor.

13. The method of claim 1, wherein the transistor parameter is a time derivative of a voltage across the second transistor or the transistor parameter is proportional to a time derivative of a voltage across the second transistor.

14. The method of claim 1, wherein the transistor parameter is indicative of an oscillation at the first transistor during the corresponding turn-on switching event during which the first transistor is transitioned to the on state.

* * * * *